United States Patent
Kuwata et al.

(10) Patent No.: US 11,621,674 B2
(45) Date of Patent: Apr. 4, 2023

(54) HIGH-EFFICIENCY AMPLIFIER

(71) Applicant: Mitsubishi Electric Corporation, Tokyo (JP)

(72) Inventors: Eigo Kuwata, Tokyo (JP); Makoto Kimura, Tokyo (JP); Jun Kamioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/094,451

(22) Filed: Nov. 10, 2020

(65) Prior Publication Data

US 2021/0075375 A1 Mar. 11, 2021

Related U.S. Application Data

(63) Continuation of application No. PCT/JP2018/021899, filed on Jun. 7, 2018.

(51) Int. Cl.
| | |
|---|---|
| *H03F 1/18* | (2006.01) |
| *H03F 3/60* | (2006.01) |
| *H03F 3/68* | (2006.01) |

(52) U.S. Cl.
CPC ............... *H03F 1/18* (2013.01); *H03F 3/60* (2013.01); *H03F 3/68* (2013.01)

(58) Field of Classification Search
CPC ..... H03F 1/18; H03F 3/60; H03F 3/68; H03F 1/56; H03F 2200/451; H03F 3/607; H03F 3/604
USPC ...................................... 330/295, 124 R, 286
See application file for complete search history.

(56) References Cited

U.S. PATENT DOCUMENTS

| | | |
|---|---|---|
| 2015/0123734 A1 | 5/2015 | Donati et al. |
| 2015/0256132 A1 | 9/2015 | Niida |

FOREIGN PATENT DOCUMENTS

| | | |
|---|---|---|
| EP | 2 919 384 A1 | 9/2015 |
| JP | H05-129854 A | 5/1993 |
| JP | 11-330813 A | 11/1999 |
| JP | 2002-135014 A | 5/2002 |

OTHER PUBLICATIONS

A Cree Company web page, "CMPA1D1E030D 30W, 13.75-14.5 GHz, 40V, GaN MMIC, Power Amplifier", Apr. 2015, https://www.wolfspeed.com/cmpa1d1e030d, pp. 1-6.
Mouginot et al., "Three Stage 6-18 GHz High Gain and High Power Amplifier based on GaN Technology", 2010 IEEE, pp. 1392-1395.
Extended European Search Report dated Apr. 12, 2021 issued in corresponding European Patent Application No. 18921684.9.
Communication pursuant to Article 94(3) EPC dated Jan. 14, 2022 in corresponding European Application No. 18 921 684.9.

*Primary Examiner* — Hafizur Rahman
*Assistant Examiner* — Khiem D Nguyen
(74) *Attorney, Agent, or Firm* — Birch, Stewart, Kolasch & Birch, LLP

(57) ABSTRACT

A high-efficiency amplifier is configured so that short stubs are provided in a line between a first substrate end and a second substrate end of a substrate, and among the short stubs, short stubs provided at locations other than both ends of the line include two short stubs and which are adjacent to each other, and which are provided at locations at which the two short stubs are to be electromagnetically coupled to each other.

4 Claims, 13 Drawing Sheets

FIG. 2
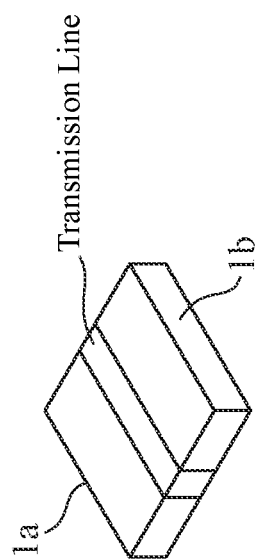
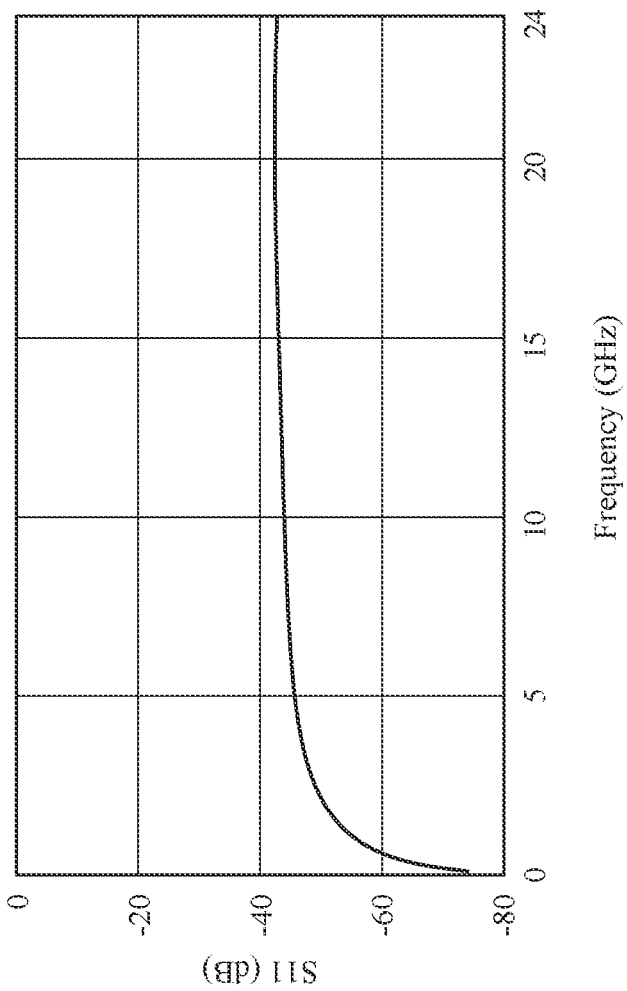

——— Loci of S11 of Transmission Line 7-1b and Transmission Line 7-4b

– – – Loci of S11 of Transmission Line 7-2b and Transmission Line 7-3b

——— Locus of Impedance at Output Terminal of Amplification Element 4-1

▬▬▬ Locus of Impedance at Output Terminal of Amplification Element 4-2

▬ ▬ ▬ Locus of Impedance at Output Terminal of Amplification Element 4-3

• • • • Locus of Impedance at Output Terminal of Amplification Element 4-4

—— Locus of Impedance at Output Terminal of Amplification Element 4-1

∞∞∞∞ Locus of Impedance at Output Terminal of Amplification Element 4-2

— — — Locus of Impedance at Output Terminal of Amplification Element 4-3

• • • • Locus of Impedance at Output Terminal of Amplification Element 4-4

——— Locus of Impedance at Output Terminal of Amplification Element 4-1

▬▬▬ Locus of Impedance at Output Terminal of Amplification Element 4-2

∞ ∞ ∞ Locus of Impedance at Output Terminal of Amplification Element 4-3

▪ ▪ ▪ ▪ Locus of Impedance at Output Terminal of Amplification Element 4-4

—△— Locus of Impedance at Output Terminal of Amplification Element 4-1

—□— Locus of Impedance at Output Terminal of Amplification Element 4-2

△ Locus of Impedance at Output Terminal of Amplification Element 4-1

□ Locus of Impedance at Output Terminal of Amplification Element 4-2

HIGH-EFFICIENCY AMPLIFIER

CROSS REFERENCE TO RELATED APPLICATION

This application is a Continuation of PCT International Application No. PCT/JP2018/021899, filed on Jun. 7, 2018, which is hereby expressly incorporated by reference into the present application.

TECHNICAL FIELD

The present invention relates to a high-efficiency amplifier that amplifies a signal to be amplified.

BACKGROUND ART

Non-Patent Literature 1 below discloses a high-efficiency amplifier in which a plurality of transistors for amplifying distributed signals to be amplified is arranged in parallel.

In the high-efficiency amplifier described in Non-Patent Literature 1, one end of each of first main lines is connected to a corresponding one of output terminals of the plurality of transistors. A second main line is connected between the other ends of the first main lines.

Each of short stubs is connected to a corresponding one of the other ends of the first main lines.

CITATION LIST

Non-Patent Literature

Non-Patent Literature 1: Three Stage 6-18 GHz High Gain and High Power Amplifier based on GaN Technology

SUMMARY OF INVENTION

Technical Problem

In the high-efficiency amplifier described in Non-Patent Literature 1, the characteristic impedance of the short stub arranged in the vicinity of the end of a substrate and the characteristic impedance of the short stub arranged at a location other than the vicinity of the end of the substrate do not match.

Therefore, there is a problem in which the impedances at the output terminals of the plurality of transistors are different from each other, which causes variations in operations of the plurality of transistors, resulting in loss and the like when the signals output from the output terminals of the plurality of transistors are synthesized.

The present invention has been accomplished to solve the above problem, and an object of the present invention is to provide a high-efficiency amplifier capable of suppressing variations in operations of a plurality of amplification elements.

Solution to Problem

A high-efficiency amplifier according to the present invention includes: a plurality of amplification elements to amplify respective signals to be amplified that have been distributed; a plurality of first main lines, each of which has one end connected to an output terminal of a corresponding one of the plurality of amplification elements; a plurality of second main lines, other ends of respective two of the plurality of first main lines being connected to each other through a corresponding one of the plurality of second main lines, the two first main lines each having the one end connected to the output terminal which is a corresponding one of output terminals of a pair of amplification elements of the plurality of amplification elements; and a plurality of short stubs each connected to a corresponding one of the plurality of second main lines, wherein the plurality of short stubs is provided in a line between a first substrate end of a substrate and a second substrate end that is a substrate end opposite the first substrate end, and among the plurality of short stubs, short stubs provided at respective locations other than both ends of the line include two short stubs which are adjacent to each other, and which are provided at respective locations at which the two short stubs are to be electromagnetically coupled to each other.

Advantageous Effects of Invention

According to the present invention, the high-efficiency amplifier is configured so that the plurality of short stubs is provided in a line between the first substrate end of the substrate and the second substrate end that is the substrate end opposite the first substrate end, and among the plurality of short stubs, short stubs provided at respective locations other than both ends of the line include two short stubs which are adjacent to each other, and which are provided at respective locations at which the two short stubs are to be electromagnetically coupled to each other. Therefore, the high-efficiency amplifier according to the present invention can suppress variations in operations of the plurality of amplification elements.

BRIEF DESCRIPTION OF DRAWINGS

FIG. 2 is an explanatory diagram showing a calculation result of S11 of S-parameters of a transmission line that is not provided at a location near a first substrate end 1*a* or a location near a second substrate end 1*b*, and that is provided at a location where it is not electromagnetically coupled with other transmission lines.

DESCRIPTION OF EMBODIMENTS

In order to describe the present invention in more detail, modes for carrying out the present invention will now be described with reference to the accompanying drawings.

First Embodiment

Figure 1:
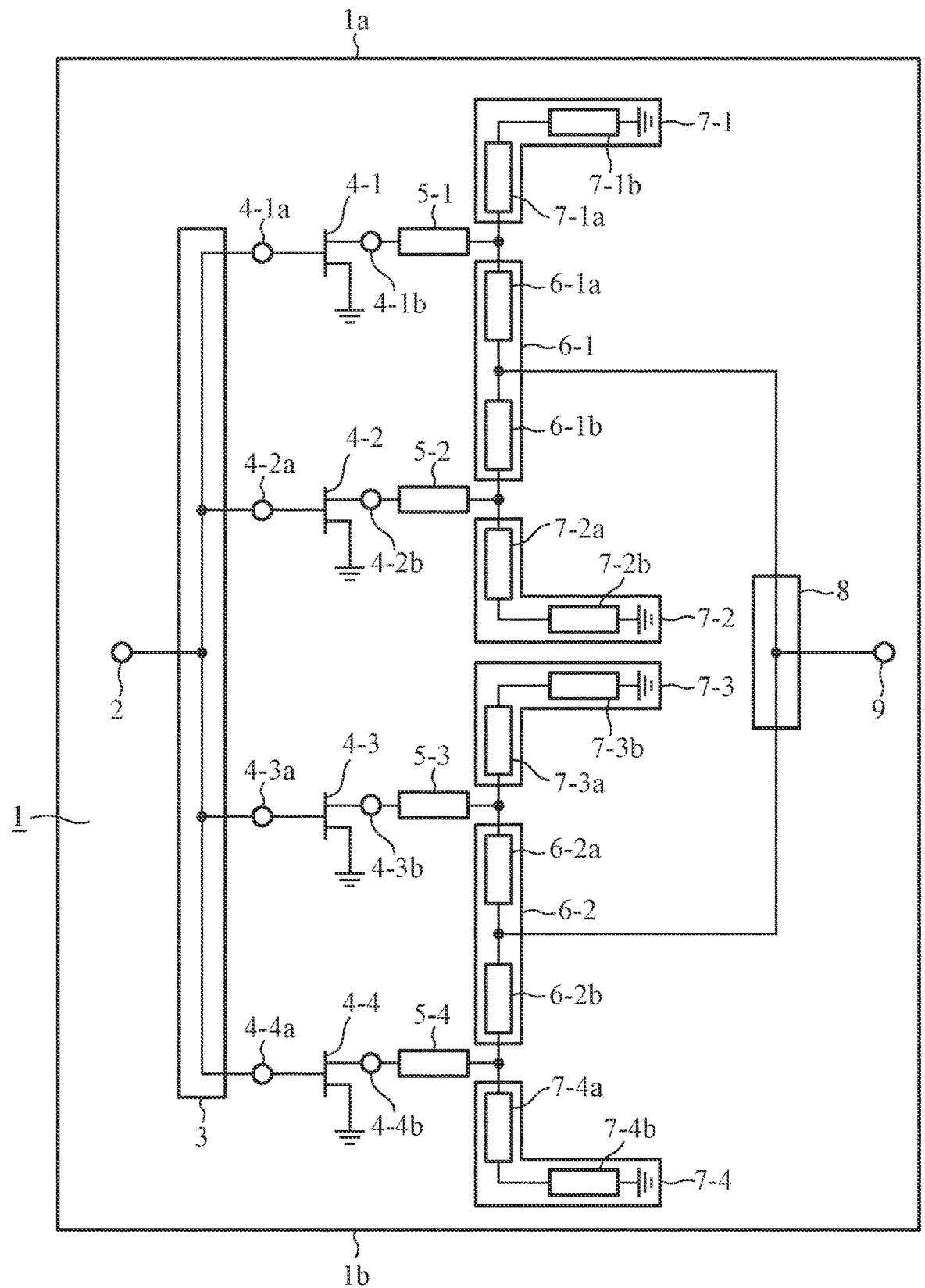
FIG. 1 is a diagram showing a configuration of a high-efficiency amplifier according to a first embodiment.

FIG. 1 is a diagram showing a configuration of a high-efficiency amplifier according to a first embodiment.

In FIG. 1, a substrate 1 is equipped with the high-efficiency amplifier.

A first substrate end 1a is an upper substrate end of the substrate 1 in FIG. 1.

A second substrate end 1b is a lower substrate end opposite the first substrate end 1a in FIG. 1.

An input terminal 2 is a terminal to which a signal to be amplified is input.

A distribution circuit 3 is a circuit that distributes the signal to be amplified input through the input terminal 2 and outputs the distributed signal to be amplified to amplification elements 4-1 to 4-4.

The amplification elements 4-1 to 4-4 are transistors having input terminals 4-1a to 4-4a and output terminals 4-1b to 4-4b, respectively.

When receiving the signal to be amplified that has been distributed by the distribution circuit 3 through the input terminal 4-na (n=1, 2, 3, 4), the amplification element 4-n amplifies the signal to be amplified, and outputs the amplified signal to a first main line 5-n through the output terminal 4-nb.

From among the amplification elements 4-1 to 4-4, the amplification element 4-1 and the amplification element 4-2 are a pair of amplification elements, and the amplification element 4-3 and the amplification element 4-4 are a pair of amplification elements.

The high-efficiency amplifier shown in FIG. 1 includes four amplification elements 4-1 to 4-4. However, this is merely an example, and the high-efficiency amplifier may include an even number of amplification elements of four or more.

One end of each of the first main lines 5-1 to 5-4 is connected to the corresponding one of the output terminals 4-1b to 4-4b of the amplification elements 4-1 to 4-4.

A second main line 6-1 includes a transmission line 6-1a and a transmission line 6-1b.

One end of the second main line 6-1 is connected to the other end of the first main line 5-1, and the other end of the second main line 6-1 is connected to the other end of the first main line 5-2.

A second main line 6-2 includes a transmission line 6-2a and a transmission line 6-2b.

One end of the second main line 6-2 is connected to the other end of the first main line 5-3, and the other end of the second main line 6-2 is connected to the other end of the first main line 5-4.

Short stubs 7-1 to 7-4 are provided in a line between the first substrate end 1a and the second substrate end 1b of the substrate 1.

The short stub 7-1 includes a transmission line 7-1a and a transmission line 7-1b.

The short stub 7-1 is provided near the first substrate end 1a, and one end of the short stub 7-1 is connected to the other end of the first main line 5-1 and the one end of the second main line 6-1.

The short stub 7-2 includes a transmission line 7-2a and a transmission line 7-2b.

The short stub 7-2 is provided at a location adjacent to the short stub 7-3, and one end of the short stub 7-2 is connected to the other end of the first main line 5-2 and the other end of the second main line 6-1.

The short stub 7-3 includes a transmission line 7-3a and a transmission line 7-3b.

The short stub 7-3 is provided at a location adjacent to the short stub 7-2, and one end of the short stub 7-3 is connected to the other end of the first main line 5-3 and the one end of the second main line 6-2.

The short stub 7-2 and the short stub 7-3 are provided at locations where they are to be electromagnetically coupled to each other.

The short stub 7-4 includes a transmission line 7-4a and a transmission line 7-4b.

The short stub 7-4 is provided near the second substrate end 1b, and one end of the short stub 7-4 is connected to the other end of the first main line 5-4 and the other end of the second main line 6-2.

A synthesis circuit 8 has one end connected to a connection point between the transmission lines 6-1a and 6-1b and the other end connected to a connection point between the transmission lines 6-2a and 6-2b.

The synthesis circuit 8 is a circuit that synthesizes the signals amplified by the amplification elements 4-1 to 4-4 and outputs the synthesized signal to an output terminal 9.

The output terminal 9 is a terminal for outputting the signal synthesized by the synthesis circuit 8.

In the high-efficiency amplifier shown in FIG. 1, the transmission lines 7-1b to 7-4b in the short stubs 7-1 to 7-4 are directly connected to the ground. However, this is merely an example, and a capacitor that cuts a DC component may be connected between each of the transmission lines 7-1b to 7-4b and the ground.

Next, the operation of the high-efficiency amplifier shown in FIG. 1 will be described.

Upon receiving the signal to be amplified through the input terminal 2, the distribution circuit 3 distributes the signal to be amplified and outputs the distributed signal to be amplified to the amplification elements 4-1 to 4-4.

When receiving the signal to be amplified that has been distributed by the distribution circuit 3, the amplification element 4-n (n=1, 2, 3, 4) amplifies the signal to be amplified, and outputs the amplified signal to the first main line 5-n through the output terminal 4-nb.

The amplified signals output from the amplification elements 4-1 to 4-4 are transmitted by the first main lines 5-1 to 5-4.

The amplified signal transmitted by the first main line 5-1 reaches the synthesis circuit 8 via the transmission line 6-1a, and the amplified signal transmitted by the first main line 5-2 reaches the synthesis circuit 8 via the transmission line 6-1b.

Further, the amplified signal transmitted by the first main line 5-3 reaches the synthesis circuit 8 via the transmission line 6-2a, and the amplified signal transmitted by the first main line 5-4 reaches the synthesis circuit 8 via the transmission line 6-2b.

The synthesis circuit 8 synthesizes the amplified signals transmitted through the transmission lines 6-1a, 6-1b, 6-2a, and 6-2b, and outputs the synthesized signal to the output terminal 9.

Next, the effect of the high-efficiency amplifier shown in FIG. 1 will be verified.

Here, it is assumed that parameters of the substrate 1 are set as follows as conditions for performing electromagnetic field calculation for the short stubs 7-1 to 7-4.

The thickness of the substrate 1 is 100 μm, the relative permittivity of the substrate 1 is 10, the dielectric loss of the substrate 1 is 0, the metal mounted on the substrate 1 is gold, and the back surface of the substrate 1 has a ground plane. The high-efficiency amplifier shown in FIG. 1 is mounted on the front surface of the substrate 1, and the back surface of the substrate 1 is the surface reverse to the front surface of the substrate 1.

It is also assumed that the transmission lines 7-1b to 7-4b each have a line width of 90 μm and the transmission lines 7-1b to 7-4b each have a line length of 500 μm.

FIG. 2 is an explanatory diagram showing a calculation result of S11 of S-parameters of a transmission line that is not provided at a position near the first substrate end 1a or a position near the second substrate end 1b, and that is provided at a position where it is not electromagnetically coupled with other transmission lines.

The calculation result shown in FIG. 2 indicates that the reflection loss is equal to or more than 40 dB, and the transmission line which is the calculation target in FIG. 2 has an almost ideal characteristic impedance of 50Ω in a frequency range of 0 to 24 GHz.

Figure 3:
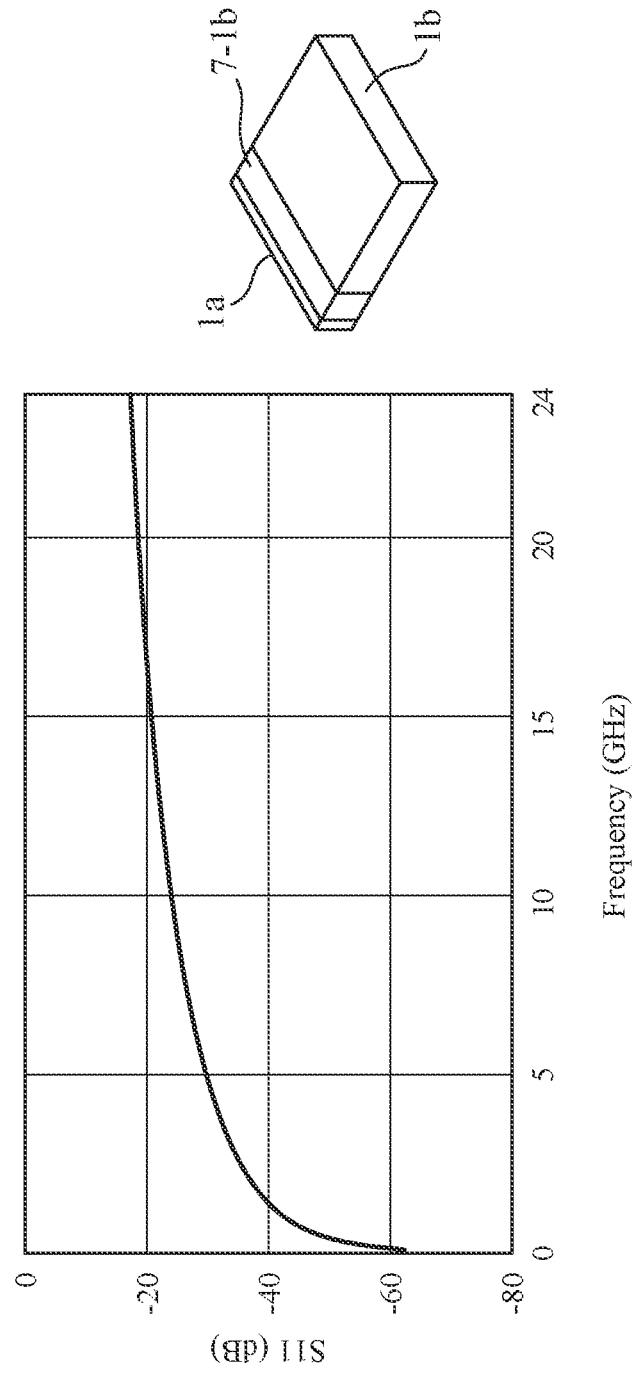
FIG. 3 is an explanatory diagram showing a calculation result of S11 of S-parameters of a transmission line 7-1*b* in a case where the distance between the first substrate end 1*a* and the transmission line 7-1*b* is 20 μm.

FIG. 3 is an explanatory diagram showing a calculation result of S11 of S-parameters of the transmission line 7-1b in a case where the distance between the first substrate end 1a and the transmission line 7-1b is 20 μm.

A calculation result of S11 of S-parameters of the transmission line 7-4b in a case where the distance between the second substrate end 1b and the transmission line 7-4b is 20 μm is the same as that in FIG. 3.

The calculation result shown in FIG. 3 indicates that the reflection loss is less than 30 dB, and the characteristic impedances of the transmission lines 7-1b and 7-4b which are calculation targets in FIG. 3 are not 50Ω.

Figure 4:
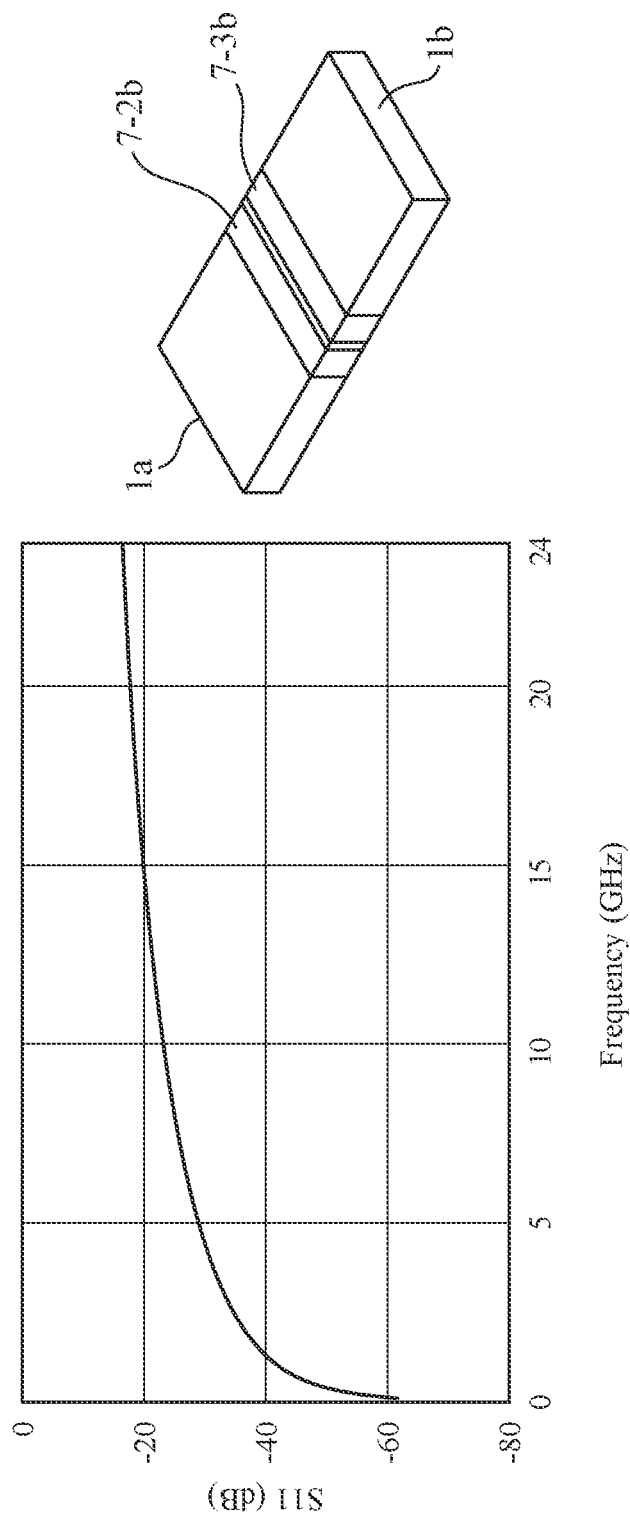
FIG. 4 is an explanatory diagram showing a calculation result of S11 of S-parameters of a transmission line 7-2*b* or 7-3*b* in a case where the distance between the transmission line 7-2*b* and the transmission line 7-3*b* which are electromagnetically coupled to each other is 40 μm, in addition to the conditions for the electromagnetic field calculation in FIG. 3.

FIG. 4 is an explanatory diagram showing a calculation result of S11 of S-parameters of the transmission line 7-2b or 7-3b in a case where the distance between the transmission line 7-2b and the transmission line 7-3b which are electromagnetically coupled to each other is 40 μm, in addition to the conditions for the electromagnetic field calculation in FIG. 3.

The calculation result shown in FIG. 4 also indicates that the reflection loss is less than 30 dB, and the characteristic impedances of the transmission lines 7-2b and 7-3b which are calculation targets in FIG. 4 are not 50Ω.

Figure 5:
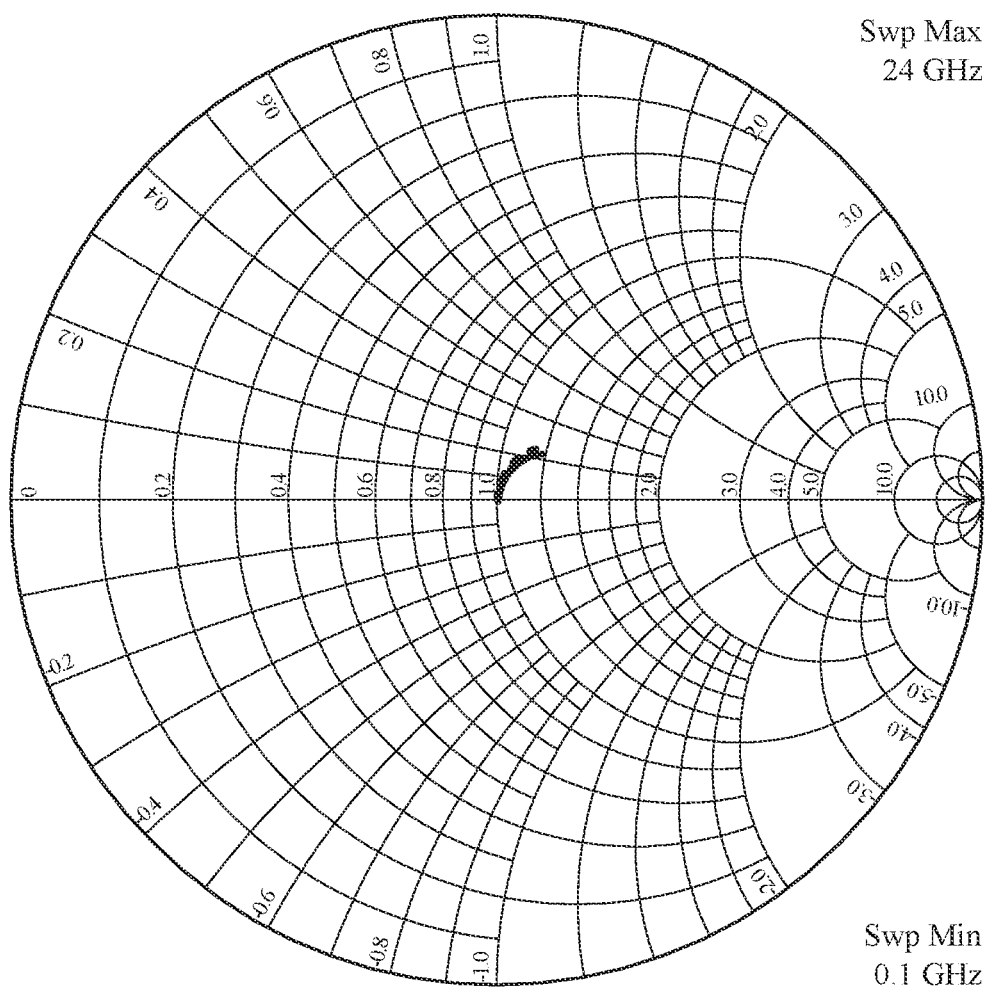
FIG. 5 is an explanatory diagram in which S11 shown in FIG. 3 and S11 shown in FIG. 4 are plotted on a Smith chart normalized to 50Ω.

FIG. 5 is an explanatory diagram in which S11 shown in FIG. 3 and S11 shown in FIG. 4 are plotted on a Smith chart normalized to 50Ω.

Neither the characteristic impedances of the transmission line 7-1b and the transmission line 7-4b nor the characteristic impedances of the transmission line 7-2b and the transmission line 7-3b are 50Ω.

However, FIG. 5 indicates that the loci of S11 of the transmission line 7-1b and the transmission line 7-4b and the loci of S11 of the transmission line 7-2b and the transmission line 7-3b are the same.

Therefore, it can be seen that the characteristic impedances of the transmission line 7-1b and the transmission line 7-4b are the same as the characteristic impedances of the transmission line 7-2b and the transmission line 7-3b.

Here, since the relative permittivity of the substrate 1 is higher than the relative permittivity of the outside of the substrate 1, electric fluxes from the transmission line 7-1b and the transmission line 7-4b to the ground plane provided on the back surface of the substrate 1 remain within the substrate 1.

In the situation where the electric fluxes from the transmission line 7-1b and the transmission line 7-4b remain within the substrate 1, the first substrate end 1a and the second substrate end 1b act as if they were magnetic walls, whereby the spread of the electric fluxes from the transmission line 7-1b and the transmission line 7-4b is suppressed.

Further, the spread of the electric fluxes from the transmission line 7-2b and the transmission line 7-3b to the ground plane is also suppressed.

Since the transmission line 7-2b and the transmission line 7-3b are electromagnetically coupled to each other, the electric flux from the transmission line 7-2b and the electric flux from the transmission line 7-3b are excited in the same phase to have the same potential. Since the two electric fluxes have the same potential, the spread of the electric fluxes from the transmission line 7-2b and the transmission line 7-3b is also suppressed.

The suppression of the spread of the electric fluxes from the transmission line 7-2b and the transmission line 7-3b is equivalent to insertion of a magnetic wall in the intermediate portion between the transmission line 7-2b and the transmission line 7-3b.

The distance between the magnetic wall equivalently inserted in the intermediate portion and the transmission line 7-2b is equal to the distance between the first substrate end 1a and the transmission line 7-1b. Here, the distance between the first substrate end 1a and the transmission line 7-1b is 20 μm, and thus, the distance between the magnetic wall equivalently inserted in the intermediate portion and the transmission line 7-2b is 20 μm.

Also, the distance between the magnetic wall equivalently inserted in the intermediate portion and the transmission line 7-3b is equal to the distance between the second substrate end 1b and the transmission line 7-4b. Here, the distance between the second substrate end 1b and the transmission line 7-4b is 20 μm, and thus, the distance between the magnetic wall equivalently inserted in the intermediate portion and the transmission line 7-3b is 20 μm.

Figure 6:
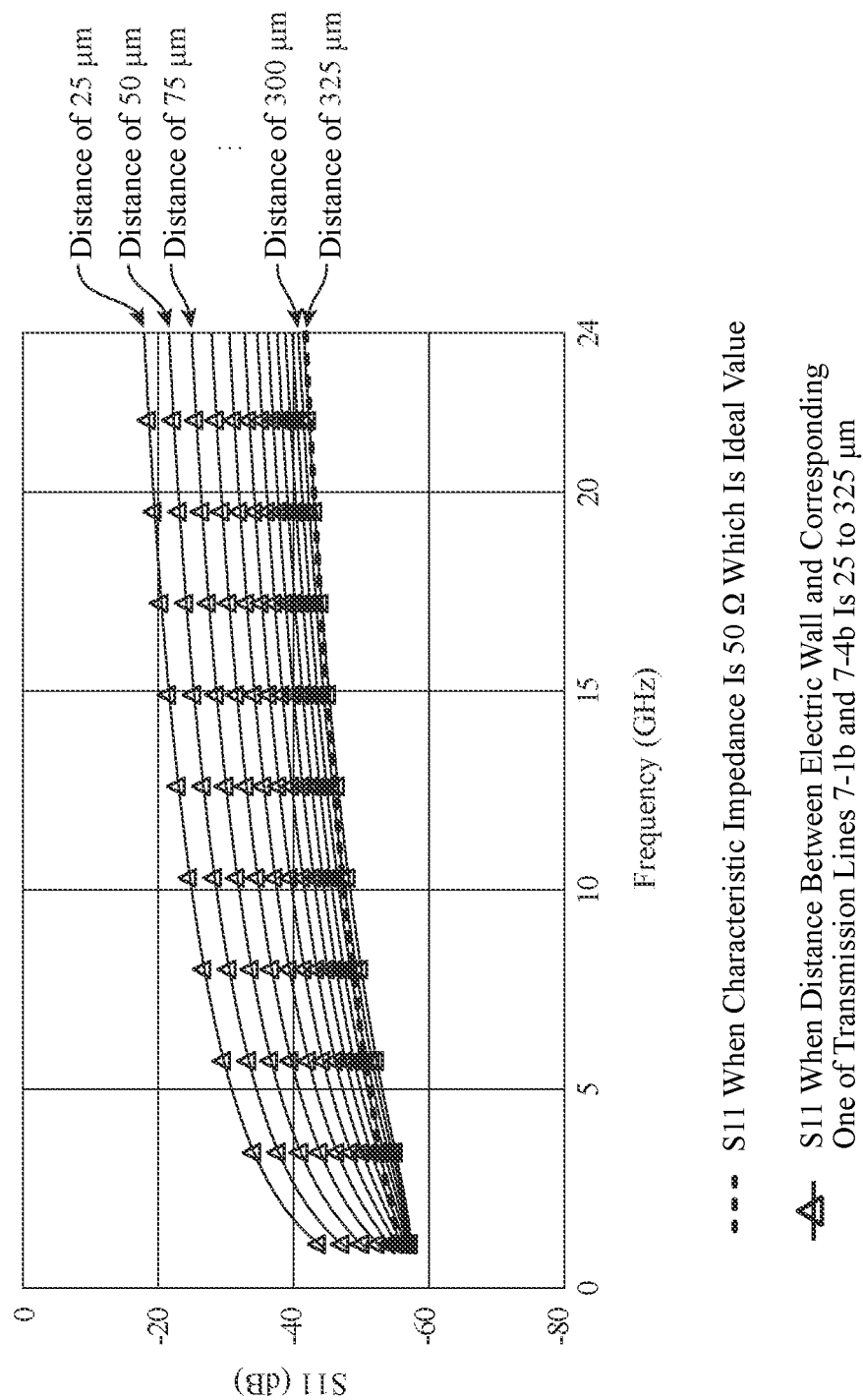
FIG. 6 is an explanatory diagram showing a calculation result of S11 when the characteristic impedance is 50Ω which is an ideal characteristic impedance, and a calculation result of S11 when the transmission line 7-2*b* and the transmission line 7-3*b* are not electromagnetically coupled to each other.

FIG. 6 is an explanatory diagram showing a calculation result of S11 when the characteristic impedance is 50Ω which is an ideal characteristic impedance, and a calculation result of S11 when the transmission line 7-2b and the transmission line 7-3b are not electromagnetically coupled to each other.

In FIG. 6, when the characteristic impedance is 50Ω which is an ideal characteristic impedance, the distance between an electric wall and a corresponding one of the transmission lines 7-1b and 7-4b is 325 μm. The electric wall exists at each of the first substrate end 1a and the second substrate end 1b.

When the transmission line 7-2b and the transmission line 7-3b are not electromagnetically coupled to each other, the distance between the electric wall and the corresponding one of the transmission lines 7-1b and 7-4b is 25 μm, 50 μm, . . . , 300 μm, or 325 μm. The distances between the electric wall and the corresponding one of the transmission lines 7-1b and 7-4b are changed in 25 μm steps.

It can be seen from FIG. 6 that in a case where the transmission lines 7-2b and 7-3b are not electromagnetically coupled to each other, the distance between the electric wall and the corresponding one of the transmission lines 7-1b and 7-4b for obtaining the calculation result equivalent to the calculation result of S11 when the characteristic impedance is ideal 50Ω is 325 μm.

The distance of 325 μm is extremely greater than 20 μm which corresponds to the distance between the first substrate end 1a and the transmission line 7-1b and between the second substrate end 1b and the transmission line 7-4b when the transmission line 7-2b and the transmission line 7-3b are electromagnetically coupled to each other.

Therefore, when the transmission line 7-2b and the transmission line 7-3b are electromagnetically coupled to each other, an upper margin of the substrate 1 in FIG. 1 and a lower margin of the substrate 1 in FIG. 1 can be decreased, whereby the high-efficiency amplifier can be downsized. The upper margin indicates a region between the first substrate end 1a and the transmission line 7-1b, and the lower margin indicates a region between the second substrate end 1b and the transmission line 7-4b.

Next, the effect of the high-efficiency amplifier shown in FIG. 1 will be verified using the impedance seen from the amplification elements.

Here, it is assumed that the first main lines 5-1 to 5-4 and the transmission lines 6-1a, 6-1b, 6-2a, 6-2b, 7-1a to 7-4a, and 7-1b to 7-4b each have a line width of 90 μm.

It is assumed that the first main lines 5-1 to 5-4 each have a line length of 200 μm, and the transmission lines 6-1a, 6-1b, 6-2a, and 6-2b each have a line length of 500 μm.

It is assumed that the transmission lines 7-1a to 7-4a each have a line length of 100 μm, and the transmission lines 7-1b to 7-4b each have a line length of 500 μm.

It is assumed that the connection point between the transmission lines 6-1a and 6-1b is terminated with 50Ω, and the connection point between the transmission lines 6-2a and 6-2b is terminated with 50Ω.

Figure 7:
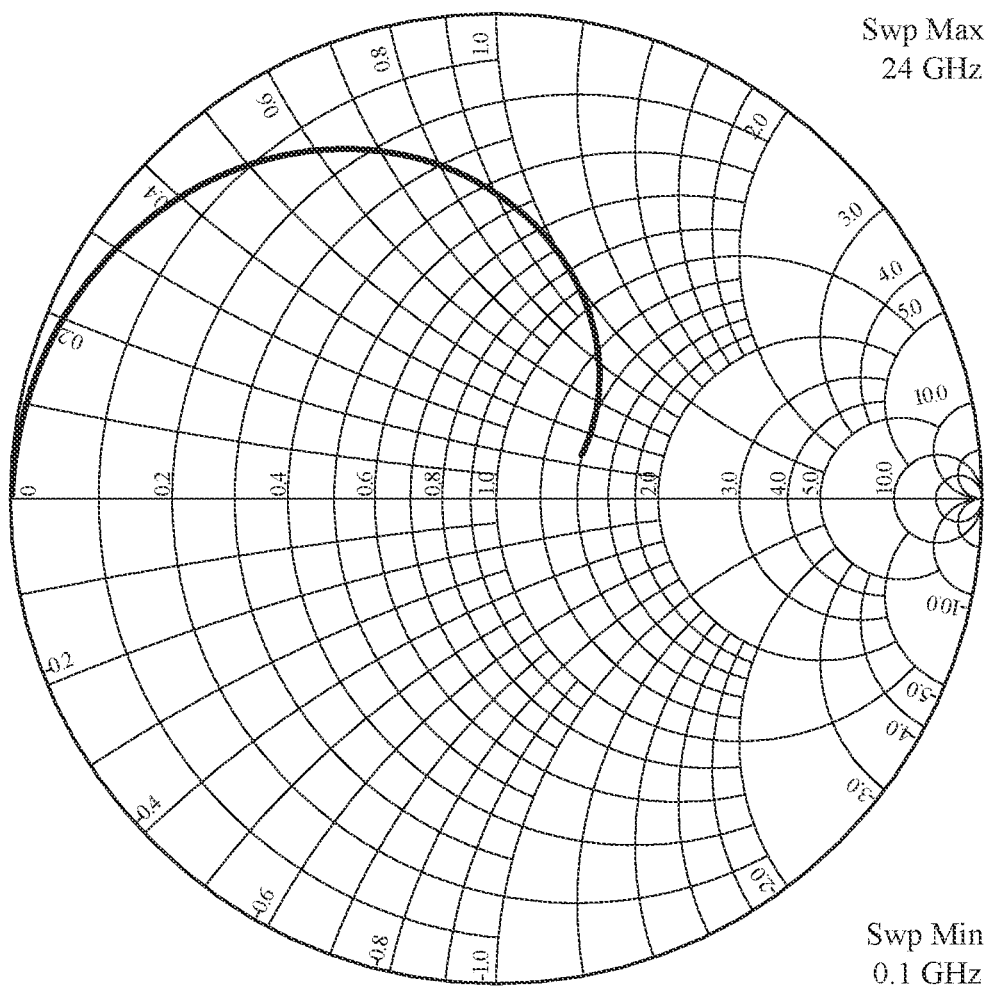
FIG. 7 is an explanatory diagram showing calculation results of impedances at output terminals 4-1*b* to 4-4*b* of amplification elements 4-1 to 4-4 when the characteristic impedances of the transmission lines 7-1*b* to 7-4*b* are 50Ω which is an ideal characteristic impedance.

FIG. 7 is an explanatory diagram showing calculation results of impedances at the output terminals 4-1b to 4-4b of the amplification elements 4-1 to 4-4 when the characteristic impedances of the transmission lines 7-1b to 7-4b are 50Ω which is an ideal characteristic impedance.

When the characteristic impedances of the transmission lines 7-1b to 7-4b are 50Ω which is an ideal characteristic impedance, the loci of the impedances at the output terminals 4-1b to 4-4b of the amplification elements 4-1 to 4-4 coincide with each other as shown in FIG. 7, and thus there are no variations in operations of the amplification elements 4-1 to 4-4.

Figure 8:
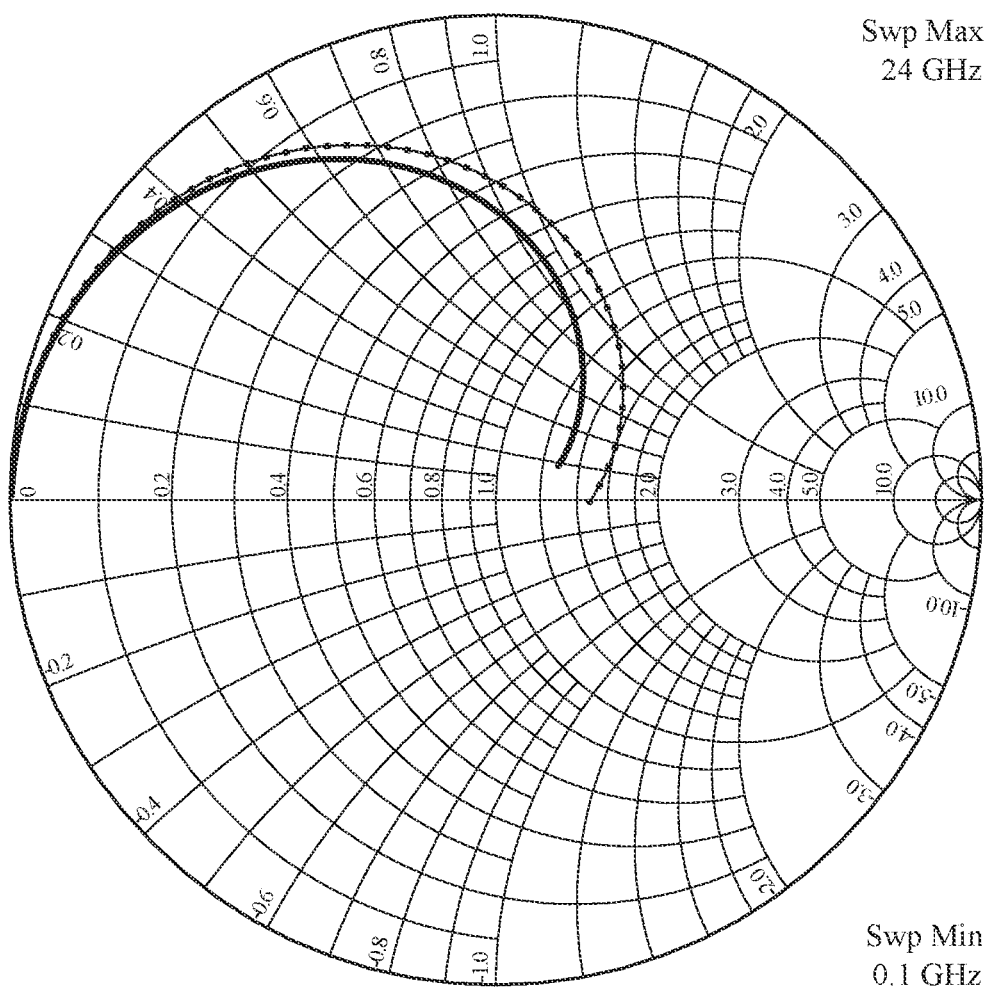
FIG. 8 is an explanatory diagram showing calculation results of impedances at output terminals of a plurality of amplification elements in the high-efficiency amplifier described in Non-Patent Literature 1.

FIG. 8 is an explanatory diagram showing calculation results of impedances at output terminals of a plurality of amplification elements in the high-efficiency amplifier described in Non-Patent Literature 1.

Assuming that a high-efficiency amplifier corresponding to the high-efficiency amplifier described in Non-Patent Literature 1 has four amplification elements 4-1 to 4-4, FIG. 8 shows the calculation results of impedances at output terminals 4-1b to 4-4b of the amplification elements 4-1 to 4-4.

In this high-efficiency amplifier, the transmission line 7-2b and the transmission line 7-3b are not electromagnetically coupled to each other.

Therefore, in this high-efficiency amplifier, the characteristic impedances of the transmission line 7-1b and the transmission line 7-4b are different from the characteristic impedances of the transmission line 7-2b and the transmission line 7-3b. Therefore, the impedance loci of the output terminals 4-1b to 4-4b of the amplification elements 4-1 to 4-4 do not match as shown in FIG. 8, so that there are variations in operations of the amplification elements 4-1 to 4-4.

Variations in operations of the amplification elements 4-1 to 4-4 cause a synthesis loss of signals in the synthesis circuit 8, and thus cause a decrease in output power, a decrease in efficiency, and a loop oscillation.

Figure 9:
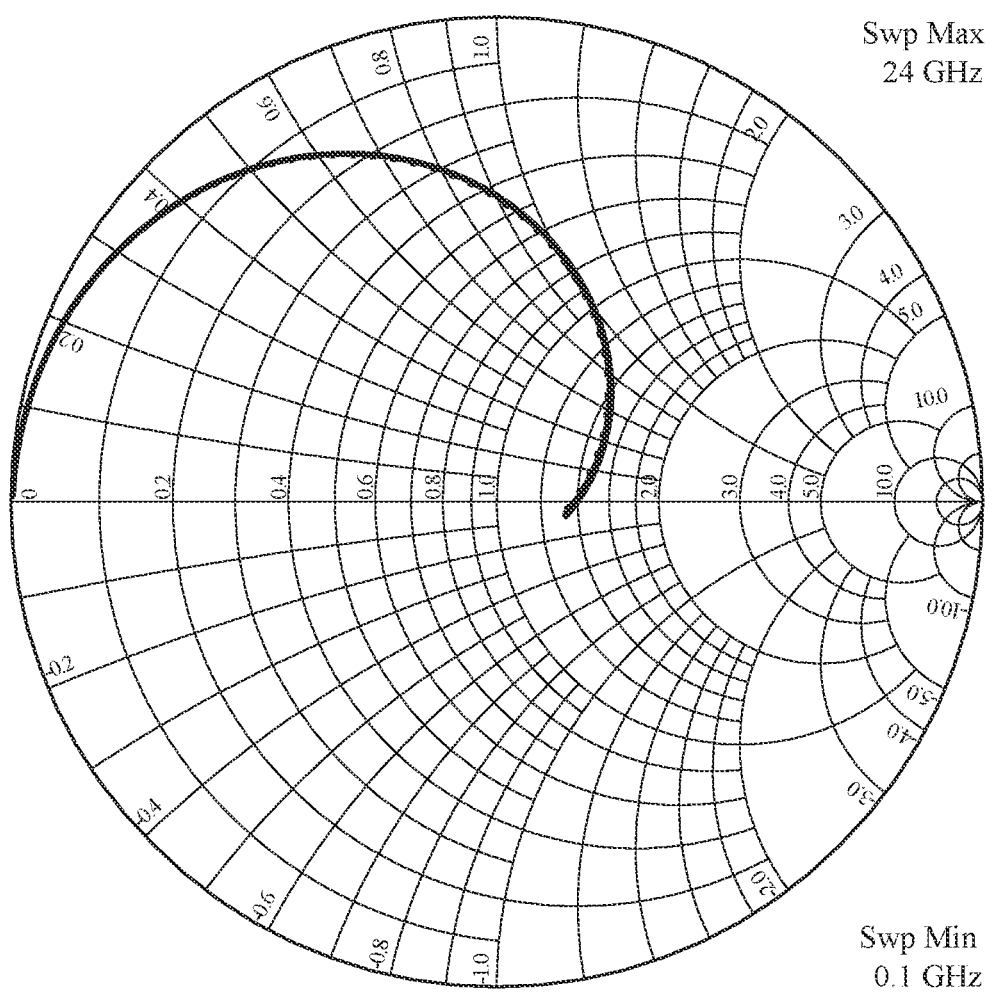
FIG. 9 is an explanatory diagram showing calculation results of impedances at the output terminals 4-1b to 4-4b of the amplification elements 4-1 to 4-4 in the high-efficiency amplifier according to the first embodiment.

FIG. 9 is an explanatory diagram showing calculation results of impedances at the output terminals 4-1b to 4-4b in the amplification elements 4-1 to 4-4 of the high-efficiency amplifier according to the first embodiment.

In the high-efficiency amplifier according to the first embodiment, the characteristic impedances of the transmission line 7-1b and the transmission line 7-4b match the characteristic impedances of the transmission line 7-2b and the transmission line 7-3b. Therefore, the loci of the impedances at the output terminals 4-1b to 4-4b of the amplification elements 4-1 to 4-4 match as shown in FIG. 9, and thus, there are no variations in operations of the amplification elements 4-1 to 4-4.

Since there are no variations in operations of the amplification elements 4-1 to 4-4, the high-efficiency amplifier according to the first embodiment can achieve higher output, higher efficiency, higher stability, and further reduction in size than the high-efficiency amplifier described in Non-Patent Literature 1. In addition, variations in impedance can be suppressed over a wide band, so that a wider band can be achieved.

In the high-efficiency amplifier according to the first embodiment, the characteristic impedances of the transmission lines 7-1b and 7-4b are higher than the ideal characteristic impedance of 50Ω Therefore, in the high-efficiency amplifier according to the first embodiment, it is necessary to set the line width of each of the transmission lines 7-1b and 7-4b to be greater than the line width of 90 μm set as a parameter of the substrate 1, in order to achieve the ideal characteristic impedance of 50Ω.

In the high-efficiency amplifier according to the first embodiment, variations in operations of the amplification elements 4-1 to 4-4 can be suppressed by the transmission lines 7-2b and 7-3b being electromagnetically coupled to each other, even if the line widths of the transmission lines 7-1b and 7-4b are increased.

Therefore, for example, in a case where the short stubs 7-1 and 7-4 are each used as a power supply path in the high-efficiency amplifier according to the first embodiment, the line widths of the transmission lines 7-1b and 7-4b can be increased.

For example, in a case where the short stubs 7-1 and 7-4 are each used as a power supply path, increasing the line widths of the transmission lines 7-1*b* and 7-4*b* increases the value of a direct current that can pass therethrough.

In the first embodiment described above, the high-efficiency amplifier is configured so that the short stubs 7-1 to 7-4 are provided in a line between the first substrate end 1*a* and the second substrate end 1*b* of the substrate 1, and among the short stubs 7-1 to 7-4, short stubs provided at locations other than both ends of the line include the two short stubs 7-2 and 7-3 which are adjacent to each other, and which are provided at locations at which the two short stubs are to be electromagnetically coupled to each other. Accordingly, the high-efficiency amplifier can suppress variations in operations of the amplification elements 4-1 to 4-4.

The distribution circuit 3 in FIG. 1 may include an amplification element. The amplification element included in the distribution circuit 3 is provided to connect the amplification elements in multiple stages, and amplifies the signal to be amplified before the amplification elements 4-1 to 4-4 amplify the signal to be amplified.

Further, the synthesis circuit 8 in FIG. 1 may include an amplification element. The amplification element included in the synthesis circuit 8 is provided to connect the amplification elements in multiple stages, and further amplifies the signals which have been amplified by the amplification elements 4-1 to 4-4.

Second Embodiment

A second embodiment describes a high-efficiency amplifier in which short stubs 7-1 to 7-4 and second main lines 6-1 to 6-4 cross one over the other, respectively.

Figure 10:
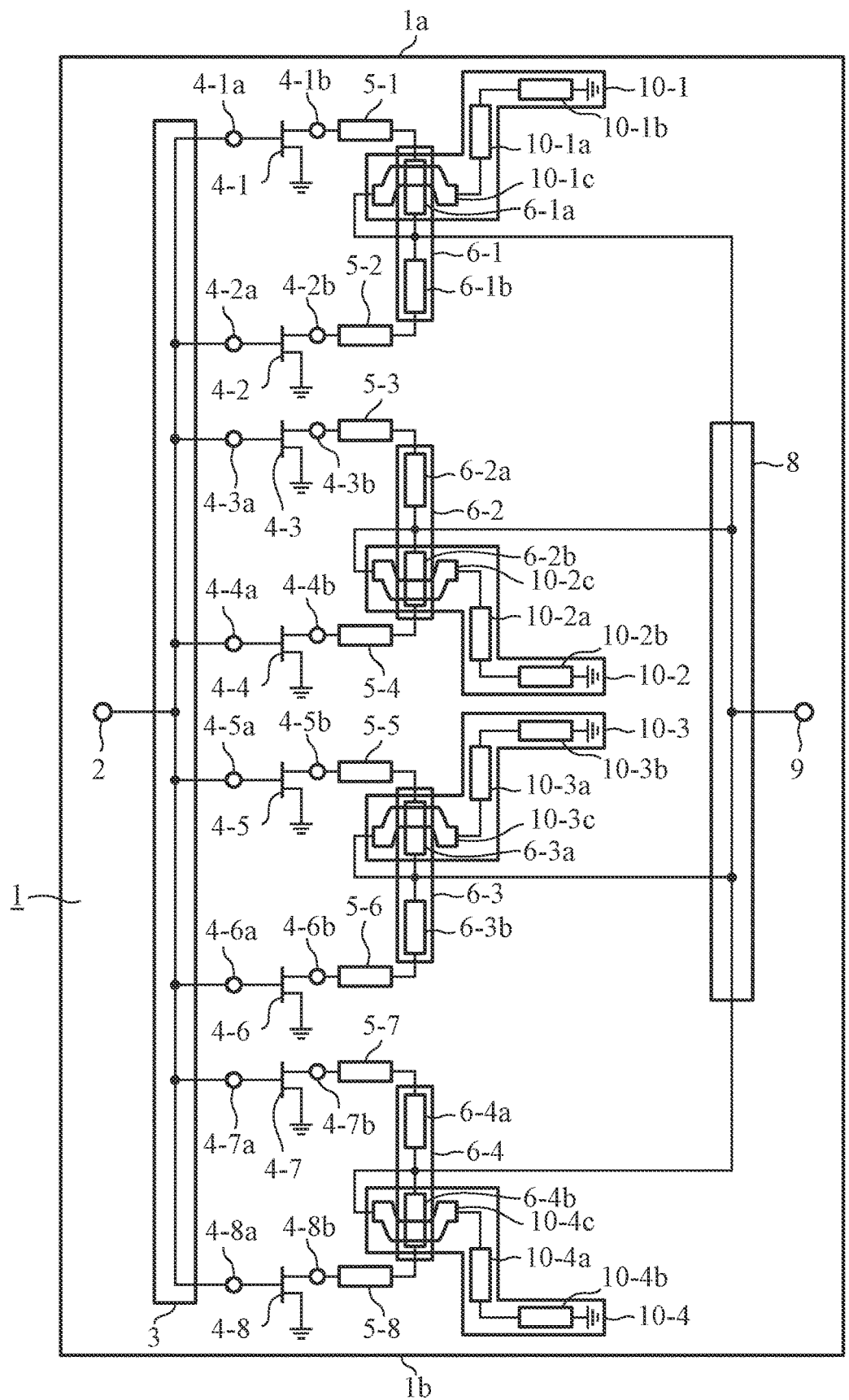
FIG. 10 is a diagram showing a configuration of a high-efficiency amplifier according to a second embodiment.

FIG. 10 is a diagram showing a configuration of the high-efficiency amplifier according to the second embodiment. In FIG. 10, elements same as or corresponding to the elements in FIG. 1 are identified by the same reference numerals, and thus, the description thereof will be omitted.

The high-efficiency amplifier shown in FIG. 10 includes eight amplification elements 4-1 to 4-8.

The amplification elements 4-1 to 4-8 are transistors having input terminals 4-1*a* to 4-8*a* and output terminals 4-1*b* to 4-8*b*, respectively.

When receiving the signal to be amplified that has been distributed by the distribution circuit 3 through the input terminal 4-*na* (n=1, 2, . . . , 8), the amplification element 4-*n* amplifies the signal to be amplified, and outputs the amplified signal to a first main line 5-*n* through the output terminal 4-*nb*.

From among the amplification elements 4-1 to 4-8, the amplification element 4-1 and the amplification element 4-2 are a pair of amplification elements, and the amplification element 4-3 and the amplification element 4-4 are a pair of amplification elements.

Further, the amplification element 4-5 and the amplification element 4-6 are a pair of amplification elements, and the amplification element 4-7 and the amplification element 4-8 are a pair of amplification elements.

One end of each of the first main lines 5-1 to 5-8 is connected to the corresponding one of the output terminals 4-1*b* to 4-8*b* of the amplification elements 4-1 to 4-8.

The second main line 6-3 includes a transmission line 6-3*a* and a transmission line 6-3*b*.

One end of the second main line 6-3 is connected to the other end of the first main line 5-5, and the other end of the second main line 6-3 is connected to the other end of the first main line 5-6.

The second main line 6-4 includes a transmission line 6-4*a* and a transmission line 6-4*b*.

One end of the second main line 6-4 is connected to the other end of the first main line 5-7, and the other end of the second main line 6-4 is connected to the other end of the first main line 5-8.

Short stubs 10-1 to 10-4 are provided in a line between a first substrate end 1*a* and a second substrate end 1*b* of a substrate 1.

The short stub 10-1 includes a transmission line 10-1*a*, a transmission line 10-1*b*, and a transmission line 10-1*c*.

The short stub 10-1 is provided near the first substrate end 1*a*, and one end of the short stub 10-1 is connected to a connection point (intermediate point) between the transmission line 6-1*a* and the transmission line 6-1*b*.

The transmission line 10-1*c* is provided so that the transmission line 10-1*c* and the transmission line 6-1*a* cross one over the other.

A dielectric member having a relative permittivity greater than 1 is inserted between the transmission line 10-1*c* and the transmission line 6-1*a*.

The short stub 10-2 includes a transmission line 10-2*a*, a transmission line 10-2*b*, and a transmission line 10-2*c*.

The short stub 10-2 is provided at a location adjacent to the short stub 10-3, and one end of the short stub 10-2 is connected to a connection point (intermediate point) between the transmission line 6-2*a* and the transmission line 6-2*b*.

The transmission line 10-2*c* is provided so that the transmission line 10-2*c* and the transmission line 6-2*b* cross one over the other.

A dielectric member having a relative permittivity greater than 1 is inserted between the transmission line 10-2*c* and the transmission line 6-2*b*.

The short stub 10-3 includes a transmission line 10-3*a*, a transmission line 10-3*b*, and a transmission line 10-3*c*.

The short stub 10-3 is provided at a location adjacent to the short stub 10-2, and one end of the short stub 10-3 is connected to a connection point (intermediate point) between the transmission line 6-3*a* and the transmission line 6-3*b*.

The short stub 10-2 and the short stub 10-3 are provided at locations where they are to be electromagnetically coupled to each other.

The transmission line 10-3*c* is provided so that the transmission line 10-3*c* and the transmission line 6-3*a* cross one over the other.

A dielectric member having a relative permittivity greater than 1 is inserted between the transmission line 10-3*c* and the transmission line 6-3*a*.

The short stub 10-4 includes a transmission line 10-4*a*, a transmission line 10-4*b*, and a transmission line 10-4*c*.

The short stub 10-4 is provided near the second substrate end 1*b*, and one end of the short stub 10-4 is connected to a connection point (intermediate point) between the transmission line 6-4*a* and the transmission line 6-4*b*.

The transmission line 10-4*c* is provided so that the transmission line 10-4*c* and the transmission line 6-4*b* cross one over the other.

A dielectric member having a relative permittivity greater than 1 is inserted between the transmission line 10-4*c* and the transmission line 6-4*b*.

Next, the operation of the high-efficiency amplifier shown in FIG. 10 will be described.

Upon receiving the signal to be amplified through the input terminal 2, the distribution circuit 3 distributes the signal to be amplified and outputs the distributed signal to be amplified to the amplification elements 4-1 to 4-8.

When receiving the signal to be amplified that has been distributed by the distribution circuit 3, the amplification element 4-*n* (n=1, 2, . . . , 8) amplifies the signal to be amplified, and outputs the amplified signal to the first main line 5-*n* from the output terminal 4-*nb*.

The amplified signals output from the amplification elements 4-1 to 4-8 are transmitted by the first main lines 5-1 to 5-8.

The amplified signal transmitted by the first main line 5-1 reaches the synthesis circuit 8 via the transmission line 6-1*a*, and the amplified signal transmitted by the first main line 5-2 reaches the synthesis circuit 8 via the transmission line 6-1*b*.

Further, the amplified signal transmitted by the first main line 5-3 reaches the synthesis circuit 8 via the transmission line 6-2*a*, and the amplified signal transmitted by the first main line 5-4 reaches the synthesis circuit 8 via the transmission line 6-2*b*.

The amplified signal transmitted by the first main line 5-5 reaches the synthesis circuit 8 via the transmission line 6-3*a*, and the amplified signal transmitted by the first main line 5-6 reaches the synthesis circuit 8 via the transmission line 6-3*b*.

Further, the amplified signal transmitted by the first main line 5-7 reaches the synthesis circuit 8 via the transmission line 6-4*a*, and the amplified signal transmitted by the first main line 5-8 reaches the synthesis circuit 8 via the transmission line 6-4*b*.

The synthesis circuit 8 synthesizes the amplified signals transmitted through the transmission lines 6-1*a*, 6-1*b*, 6-2*a*, 6-2*b*, 6-3*a*, 6-3*b*, 6-4*a*, and 6-4*b* and outputs the synthesized signal to the output terminal 9.

The high-efficiency amplifier shown in FIG. 1 has the same number of short stubs 7-1 to 7-4 as the amplification elements 4-1 to 4-4, while the high-efficiency amplifier shown in FIG. 10 has the four short stubs 10-1 to 10-4 corresponding to half the number of the amplification elements 4-1 to 4-8.

In the high-efficiency amplifier shown in FIG. 10, in order to reduce the number of short stubs to be mounted, the short stubs 10-1 to 10-4 are connected not to both ends of the second main lines 6-1 to 6-4 but to the intermediate points of the second main lines 6-1 to 6-4.

Here, taking the short stub 10-1 from among the short stubs 10-1 to 10-4 as an example, a circuit pattern in a case where the short stub 10-1 is connected to the intermediate point of the second main line 6-1 will be described.

Figure 11:
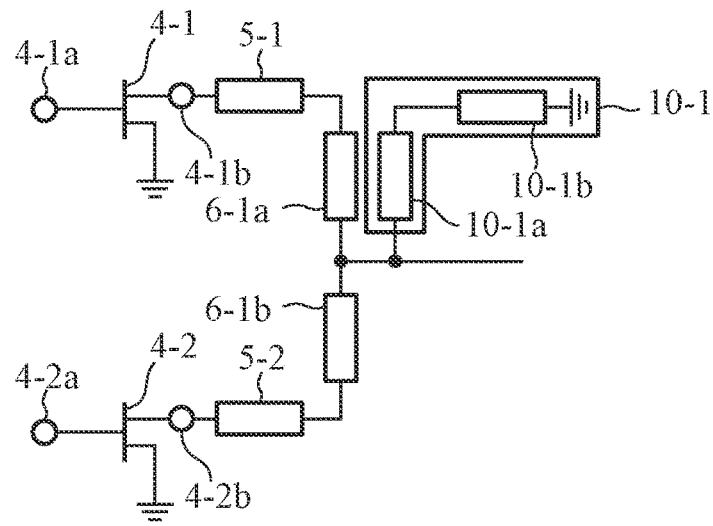
FIG. 11 is a circuit diagram showing an example of a general circuit pattern when a short stub 10-1 is connected to an intermediate point of a second main line 6-1.

FIG. 11 is a circuit diagram showing an example of a general circuit pattern when the short stub 10-1 is connected to the intermediate point of the second main line 6-1.

In the circuit pattern shown in FIG. 11, the transmission line 6-1*a* and the transmission line 10-1*a* are arranged side by side in order to reduce the circuit size.

However, when the transmission line 6-1*a* and the transmission line 10-1*a* are arranged side by side, the transmission line 6-1*a* and the transmission line 10-1*a* may be electromagnetically coupled.

When the transmission line 6-1*a* and the transmission line 10-1*a* are electromagnetically coupled, the impedance seen from the amplification element 4-1 toward the output side is different from the impedance seen from the amplification element 4-2 toward the output side.

Figure 12:
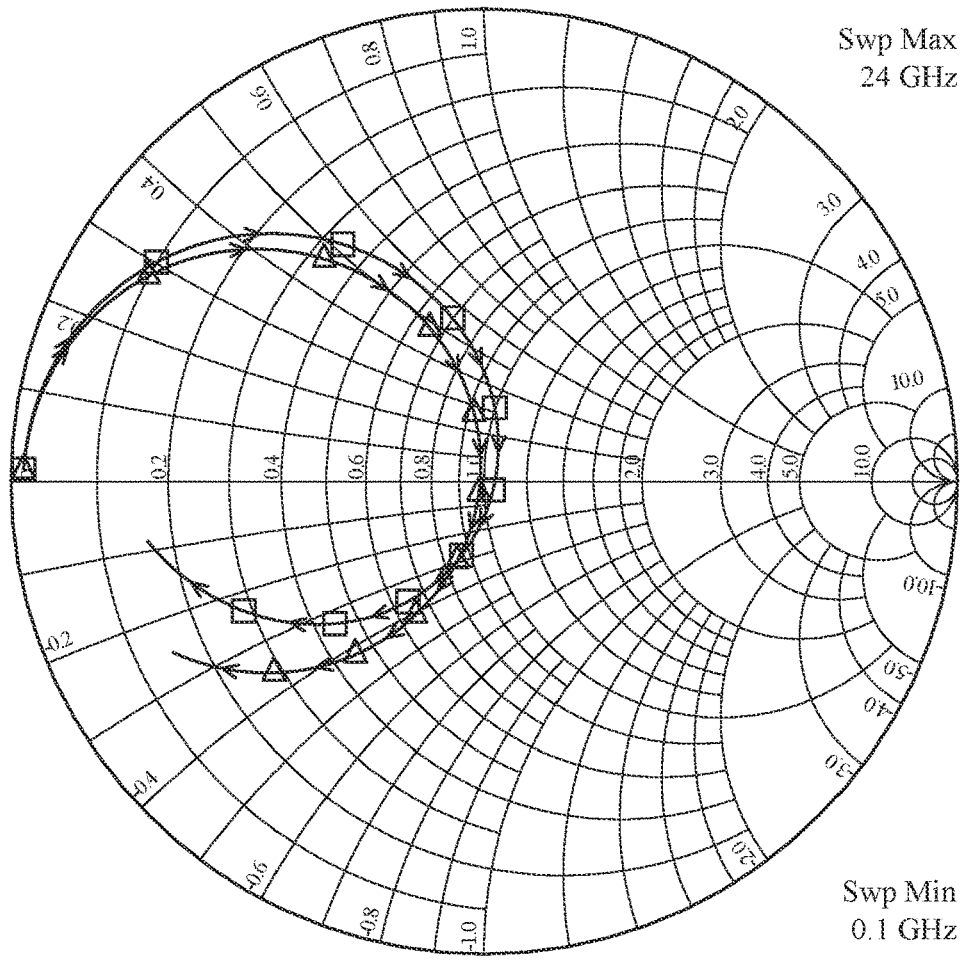
FIG. 12 is an explanatory diagram showing calculation results of an impedance at an output terminal 4-1b of an amplification element 4-1 and an impedance at an output terminal 4-2b of an amplification element 4-2 in the circuit pattern shown in FIG. 11.

FIG. 12 is an explanatory diagram showing calculation results of the impedance at the output terminal 4-1*b* of the amplification element 4-1 and the impedance at the output terminal 4-2*b* of the amplification element 4-2 in the circuit pattern shown in FIG. 11.

The impedance calculation conditions are as follows.

It is assumed that the first main lines 5-1 and 5-2 and the transmission lines 6-1*a*, 6-1*b*, 10-1*a*, and 10-1*b* each have a line width of 90 μm.

It is assumed that the transmission lines 6-1*a*, 6-1*b*, and 10-1*a* each have a line length of 290 μm, the first main lines 5-1 and 5-2 each have a line length of 10 μm, and the transmission line 10-1*b* has a line length of 1850 μm.

It is also assumed that the total of the electrical lengths of the transmission line 10-1*a* and the transmission line 10-1*b* is a quarter wavelength length at 12 GHz.

It can be seen from FIG. 12 that the calculation result of the impedance at the output terminal 4-1*b* of the amplification element 4-1 is different from the calculation result of the impedance at the output terminal 4-2*b* of the amplification element 4-2.

The high-efficiency amplifier shown in FIG. 10 has a circuit pattern in which the transmission line 10-1*c* and the transmission line 6-1*a* cross one over the other, and the transmission line 6-1*a* and the transmission line 10-1*a* are not arranged side by side, instead of the circuit pattern shown in FIG. 11.

Figure 13:
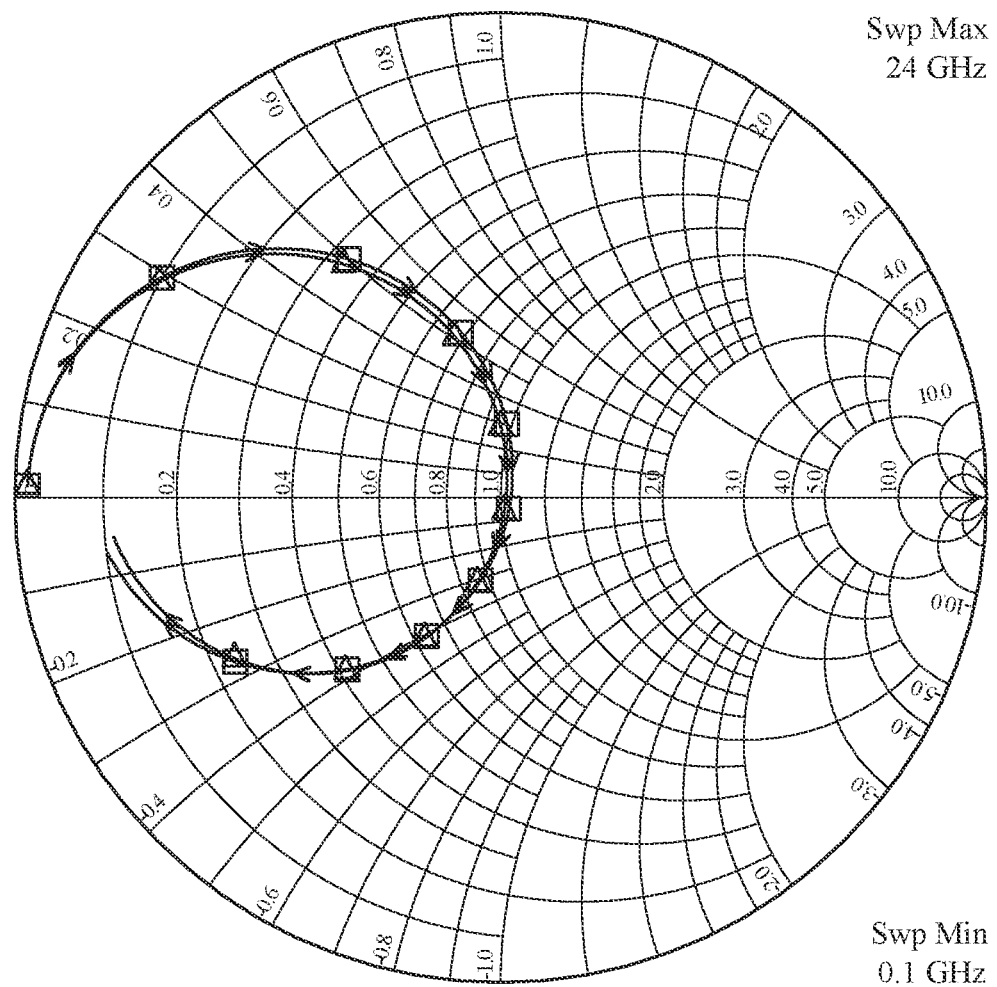
FIG. 13 is an explanatory diagram showing calculation results of the impedance at the output terminal 4-1b of the amplification element 4-1 and the impedance at the output terminal 4-2b of the amplification element 4-2 in the high-efficiency amplifier shown in FIG. 10.

FIG. 13 is an explanatory diagram showing calculation results of the impedance at the output terminal 4-1*b* of the amplification element 4-1 and the impedance at the output terminal 4-2*b* of the amplification element 4-2 in the high-efficiency amplifier shown in FIG. 10.

The impedance calculation conditions are as follows.

It is assumed that the first main lines 5-1 and 5-2 and the transmission lines 6-1*a*, 6-1*b*, 10-1*a*, 10-1*b*, and 10-1*c* each have a line width of 90 μm, the transmission lines 6-1*a* and 6-1*b* each have a line length of 290 μm, and the transmission line 10-1*c* has a line length of 590 μm.

Further, it is assumed that the total of the line lengths of the transmission line 10-1*a* and the transmission line 10-1*b* is 1540 μm, and the total of the electrical length of the transmission line 10-1*a*, the electrical length of the transmission line 10-1*b*, and the electrical length of the transmission line 10-1*c* is a quarter wavelength length at 12 GHz.

It can be seen from FIG. 13 that the calculation result of the impedance at the output terminal 4-1*b* of the amplification element 4-1 matches the calculation result of the impedance at the output terminal 4-2*b* of the amplification element 4-2.

Accordingly, the high-efficiency amplifier shown in FIG. 10 can suppress variations in operations of the amplification elements 4-1 to 4-8.

Next, the crossover structure between the short stubs 10-1 to 10-4 and the second main lines 6-1 to 6-4 will be described.

Figure 14:
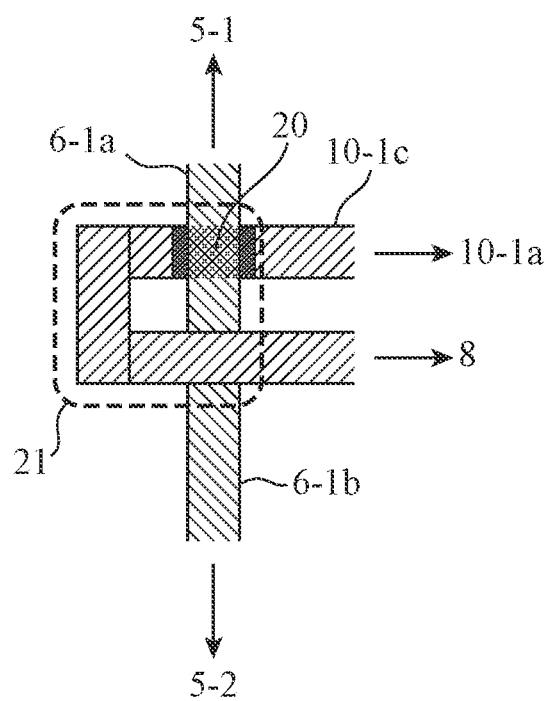
FIG. 14 is an explanatory diagram showing a crossover structure.

FIG. 14 is an explanatory diagram showing the crossover structure.

FIG. 14 shows, as an example, a crossover structure between the short stub 10-1 and the second main line 6-1.

In FIG. 14, a crossover section 20 is a portion where the transmission line 10-1*c* and the transmission line 6-1*a* cross one over the other.

A dielectric member having a relative permittivity greater than 1 is inserted between the transmission line 10-1*c* and the transmission line 6-1*a*.

Examples of conceivable dielectric members each having a relative permittivity larger than 1 include an air layer having an air bridge structure and an insulating layer having a dielectric inserted therein.

Here, when the capacitance value of a capacitor formed at the crossover section 20 by the transmission line 10-1*c* and the transmission line 6-1*a* is appropriately set, the resonance frequency in a region 21 enclosed by a dashed line in FIG. 14 can be set to a desired frequency.

The capacitance value of the capacitor can be changed by appropriately adjusting the area where the transmission line 10-1*c* and the transmission line 6-1*a* overlap.

The high-efficiency amplifier shown in FIG. 10 can function as a band stop filter using the resonance frequency of the region 21 as a cutoff frequency.

Therefore, the high-efficiency amplifier shown in FIG. 10 can function as a filter that blocks harmonics if the resonance frequency in the region 21 is the second harmonic frequency or the third harmonic frequency of the operating frequency.

Suppose that the resonance frequency in the region 21 is the third harmonic frequency of the operating frequency, and the electrical length of each of the short stubs 10-1 to 10-4 is a half wavelength in the second harmonic frequency of the operating frequency. In that case, in the high-efficiency amplifier shown in FIG. 10, an F-class harmonics matching condition can be given to the amplification elements 4-1 to 4-8, whereby the efficiency of the amplification elements 4-1 to 4-8 can be improved.

The distribution circuit 3 in FIG. 10 may include an amplification element. The amplification element included in the distribution circuit 3 is provided to connect the amplification elements in multiple stages, and amplifies the signal to be amplified before the amplification elements 4-1 to 4-8 amplify the signal to be amplified.

Further, the synthesis circuit 8 in FIG. 10 may include an amplification element. The amplification element included in the synthesis circuit 8 is provided to connect the amplification elements in multiple stages, and further amplifies the signals which have been amplified by the amplification elements 4-1 to 4-8.

It is to be noted that the above embodiments can be freely combined, or any component in the embodiments can be modified or omitted, within the scope of the present invention.

INDUSTRIAL APPLICABILITY

The present invention is suitable for a high-efficiency amplifier that amplifies a signal to be amplified.

REFERENCE SIGNS LIST

1: substrate, 1*a*: first substrate end, 1*b*: second substrate end, 2: input terminal, 3: distribution circuit, 4-1 to 4-8: amplification element, 4-1*a* to 4-8*a*: input terminal, 4-1*b* to 4-8*b*: output terminal, 5-1 to 5-8: first main line, 6-1 to 6-4: second main line, 6-1*a* to 6-4*a*, 6-1*b* to 6-4*b*: transmission line, 7-1 to 7-4: short stub, 7-1*a* to 7-4*a*, 7-1*b* to 7-4*b*: transmission line, 8: synthesis circuit, 9: output terminal, 10-1 to 10-4: short stub, 10-1*a* to 10-4*a*, 10-1*b* to 10-4*b*, 10-1*c* to 10-4*c*: transmission line, 20: crossover section, 21: region

The invention claimed is:

1. A high-efficiency amplifier comprising:
a plurality N of amplification elements to amplify respective signals to be amplified that have been distributed, N being an even number greater or equal to 4;
a plurality of first main lines, each of the plurality of main lines having one end connected to an output terminal of a corresponding one of the plurality N of amplification elements and an other end;
a plurality of second main lines, each of the plurality of second main lines having a first end and a second end, the first and second ends being respectively connected to the other ends of a respective two of the plurality of first main lines thereby connecting the respective two of the plurality of first main lines to each other through a corresponding one of the plurality of second main lines, the respective two of the plurality of first main lines each having the one end connected to the output terminal of a corresponding one of the amplification elements thereby forming a plurality of pairs of amplification elements from the plurality N of amplification elements; and
a plurality of short stubs, each of the plurality of short stubs being connected to a corresponding one of the plurality of second main lines, wherein
the first and second ends of each of the plurality of second main lines are respectively connected to a different one of the plurality of main line other ends,
the plurality of short stubs are positioned along a line extending between first and second substrate ends, where the first substrate end is a substrate end opposite the second substrate end,
two of the plurality of short stubs are respectively positioned at the first and second substrate ends,
among the plurality of short stubs, short stubs provided at respective locations other than the first and second substrate ends, include two short stubs positioned adjacent to each other and provided between adjacent pairs of amplification element at respective locations at which the two short stubs are to be electromagnetically coupled to each other, and
each of the plurality of second main lines includes a first transmission line and a second transmission line, and is connected to a synthesis circuit at a point between the first transmission line and the second transmission line.

2. The high-efficiency amplifier according to claim 1, wherein each of the plurality of short stubs is connected to a corresponding one of other ends of the respective plurality of first main lines.

3. An high-efficiency amplifier comprising:
a plurality N of amplification elements to amplify respective signals to be amplified that have been distributed, N being an even number greater or equal to 4;
a plurality of first main lines, each of the plurality of main lines having one end connected to an output terminal of a corresponding one of the plurality N of amplification elements and an other end;
a plurality of second main lines, each of the plurality of second main lines having a first end and a second end, the first and second ends being respectively connected to the other ends of a respective two of the plurality of first main lines thereby connecting the respective two of the plurality of first main lines to each other through a corresponding one of the plurality of second main lines, the respective two of the plurality of first main lines each having the one end connected to the output terminal of a corresponding one of the amplification elements thereby forming a plurality of pairs of amplification elements from the plurality N of amplification elements; and
a plurality of short stubs, each of the plurality of short stubs being connected to a corresponding one of the plurality of second main lines, wherein
the first and second ends of each of the plurality of second main lines are respectively connected to a different one of the plurality of main line other ends, the plurality of short stubs are positioned along a line extending between first and second substrate ends, where the first substrate end is a substrate end opposite the second substrate end, two of the plurality of short stubs are respectively positioned at the first and second substrate ends, among the plurality of short stubs, short stubs provided at respective locations other than the first and second substrate ends, include two short stubs positioned adjacent to each other and provided between adjacent pairs of amplification element at respective locations at which the two short stubs are to be electromagnetically coupled to each other, each of the plurality of short stubs is connected to the corresponding one of the plurality of second main lines at an intermediate point of the respective plurality of second main lines, and a transmission line of each of the short stubs crosses over the corresponding one of the second main lines with which it is connected.

4. The high-efficiency amplifier according to claim 3, wherein, at a position where each of the short stubs and a corresponding one of the second main lines cross over each other, a dielectric member having a relative permittivity larger than 1 is provided between the transmission line each of the short stubs and the corresponding one of the second main lines.

\* \* \* \* \*